(12) United States Patent
Ikeda

(10) Patent No.: US 6,366,181 B1
(45) Date of Patent: Apr. 2, 2002

(54) ADJUSTING METHOD FOR GROUP-DELAY CHARACTERISTICS OF PIEZOELECTRIC RESONATORS

(75) Inventor: Isao Ikeda, Toyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/559,231

(22) Filed: Apr. 25, 2000

(30) Foreign Application Priority Data

Apr. 26, 1999 (JP) .......................... 11-117596
Jan. 31, 2000 (JP) .......................... 12-021500

(51) Int. Cl.⁷ .............................. H03H 9/54; H03H 9/15
(52) U.S. Cl. ................... 333/188; 333/189; 310/312; 310/326; 310/345; 310/348
(58) Field of Search ................... 333/187, 188, 333/189, 190; 310/345, 348, 312, 326, 327

(56) References Cited

U.S. PATENT DOCUMENTS

| 4,308,482 A | * | 12/1981 | Kadohashi | 310/345 X |
| 4,398,162 A | * | 8/1983 | Nagai | 333/189 |
| 5,717,366 A | * | 2/1998 | Ozeki et al. | 333/189 |
| 5,939,957 A | * | 8/1999 | Iwata | 333/189 |
| 5,973,579 A | * | 10/1999 | Asakawa et al. | 333/189 X |
| 6,016,024 A | * | 1/2000 | Unami et al. | 310/345 |

FOREIGN PATENT DOCUMENTS

| JP | 55-20052 | * | 2/1980 | |
| JP | 5-145372 | * | 6/1993 | 333/190 |

* cited by examiner

Primary Examiner—Robert Pascal
Assistant Examiner—Barbara Summons
(74) Attorney, Agent, or Firm—Keating & Bennett, LLP

(57) ABSTRACT

A group-delay-characteristics adjusting method allows group-delay characteristics of piezoelectric resonators to be easily adjusted without affecting the electrical characteristics thereof. Piezoelectric resonators are arranged on an insulating substrate and are connected in a ladder arrangement, thereby defining a piezoelectric filter. Silicon sheets, each of which has a Young modulus that is about 100 MPa or smaller, are prepared to adjust the group-delay characteristics of the piezoelectric resonators. Then, characteristics of the piezoelectric resonators are measured. The silicon sheets having a size that is appropriate to achieve the required group-delay characteristics are selected, and adhered onto the individual piezoelectric resonators.

18 Claims, 5 Drawing Sheets

ADJUSTING METHOD FOR GROUP-DELAY CHARACTERISTICS OF PIEZOELECTRIC RESONATORS

BACKGROUND OF THE INVENTION

1. Field of the Invention

The present invention relates to a method of adjusting group-delay characteristics of piezoelectric resonators and more particularly, the present invention relates to a method of adjusting group-delay characteristics of piezoelectric resonators included in a ladder type filter.

2. Description of the Related Art

A conventional device shown in FIG. 9 includes a synthetic resin material 2, such as silicon oil or silicon rubber that is not cured and that has been adhered onto, for example, an upper surface or a lower surface of a piezoelectric resonator 1. Subsequently, the synthetic resin material 2 has been cured so as to be used for adjustment of group-delay characteristics of a piezoelectric resonator 1. The soft material is adhered onto the piezoelectric resonator 1 to perform damping of Qm characteristics, thereby allowing the group-delay characteristics to be adjusted.

In adhering the uncured materials onto the piezoelectric resonator, however, quantitative control for the adhesion materials is difficult. This causes variation in the amount of the adhesion materials by approximately 10%. Also, the difficulty in the quantitative control of the uncured material makes it difficult to selectively perform the adjustment corresponding to the initial group-delay characteristics of the individual piezoelectric resonators. To solve these problems, for example, preliminary examinations and periodical quantitative checking of the uncured materials must be performed. In addition, in using the uncured material, since determination of adhesion portions for the piezoelectric resonator is difficult, as shown in FIG. 9, the uncured material occasionally flows to a peripheral surface of the piezoelectric resonator. When synthetic resin material is applied on predetermined portions of the piezoelectric resonators, there are cases where characteristics of devices using the piezoelectric resonators, such as the piezoelectric filter, are reduced depending on the adhesion portion of the uncured material. In addition, use of the uncured material requires heat-curing after the adhesion thereof, thereby making the adjustment to be difficult. In this case, heating may cause reduction in the characteristics of the piezoelectric resonators.

SUMMARY OF THE INVENTION

In order to solve the problems described above, preferred embodiments of the present invention provide a method of adjusting group-delay characteristics of piezoelectric resonators that is performed easily and without affecting electrical characteristics thereof.

According to one preferred embodiment of the present invention, a method of adjusting group-delay characteristics of piezoelectric resonators includes preparing members having multiple sizes and each having a maximum Young's modulus of about 100 Mpa, measuring initial group-delay characteristics of the piezoelectric resonators, selecting the members having a size which is suitable for use with the piezoelectric resonators for adjusting the initial group-delay characteristics measured in the measuring step to achieve a required group-delay characteristics, and adhering the members selected in the selecting step onto the piezoelectric resonators.

According to another preferred embodiment of the present invention, a method of adjusting group-delay characteristics of piezoelectric resonators includes measuring as a preliminary examination for measuring group-delay characteristics of the piezoelectric resonators, preparing members having various sizes and a maximum Young's modulus of about 100 MPa and each being formed to be adapted for adjustment thereof to achieve required group-delay characteristics of the piezoelectric resonators that will be manufactured in a later step, and adhering the members onto the piezoelectric resonators.

In one of the above-described methods of adjusting group-delay characteristics of piezoelectric resonators, each of the members may be a silicon sheet having an adherent portion on one surface thereof.

Also, in one of the above-described methods of adjusting group-delay characteristics of piezoelectric resonators, each of the members may be a cured synthetic resin material.

As described above, by adhering the members having the maximum Young's modulus of about 100 MPa onto the individual piezoelectric resonators, damping of Qm characteristics of the individual piezoelectric resonators is performed, and the group-delay characteristics are easily and accurately adjusted. In this case, using cured members allows control of the amount of materials adhered onto the piezoelectric resonators. Also, the members determined to be adhered are selected based on the initial group-delay characteristics of the individual piezoelectric resonators, and the selected members are then adhered. According to this arrangement, the group-delay characteristics can be adjusted selectively corresponding to the individual piezoelectric resonators.

Alternatively, preliminary examinations are carried out to measure the initial group-delay characteristics, members of a size determined to be suitable for adhesion onto the group-delay characteristics of the piezoelectric resonators that will be manufactured in a later step are prepared, and the members are adhered onto the individual piezoelectric resonators. This also allows the group-delay characteristics to be adjusted.

In the above-described methods, since the members are already cured, portions of adhesion of the members which are joined onto the piezoelectric resonators are accurately specified. Also, the materials of the members do not flow to undesired locations, reduction in the characteristics can be prevented. In addition, the described materials used for forming the members require no heat treatments after they are adhered.

When the silicon sheets each having an adherent portion on one surface are used to form the members for the methods described above, they can be precut to have a predetermined size. This facilitates adhesion of the silicon sheets onto the piezoelectric resonators.

Also, instead of the members having a sheet-like configuration, synthetic resin materials which are formed to have a predetermined size may be used as the members so as to produce equivalent advantages.

In this way, according to various preferred embodiments of the present invention, the group-delay characteristics of the piezoelectric resonators can be implemented easily. For example, a method according to preferred embodiments of the present invention does not require processing such as heat treatment. Also, preferred embodiments of the present invention allow precise adjustment to be achieved, thereby minimizing variation in the amount of the sheet members adhered onto the individual piezoelectric resonators. In addition, preferred embodiments of the present invention allow the sheet members to be adhered onto required portions of the individual piezoelectric resonators, thereby preventing reduction in the characteristics thereof, which can be caused depending on the portions where the members are adhered. Furthermore, preferred embodiments of the present invention do not require heat treatment for curing the sheet members, thereby preventing the reduction in the characteristics, which can be caused by heating.

The described and other objects, features and advantages of the present invention will be more readily apparent from a detailed description given below with reference to the accompanying drawings.

DETAILED DESCRIPTION OF PREFERRED EMBODIMENTS

Figure 1:
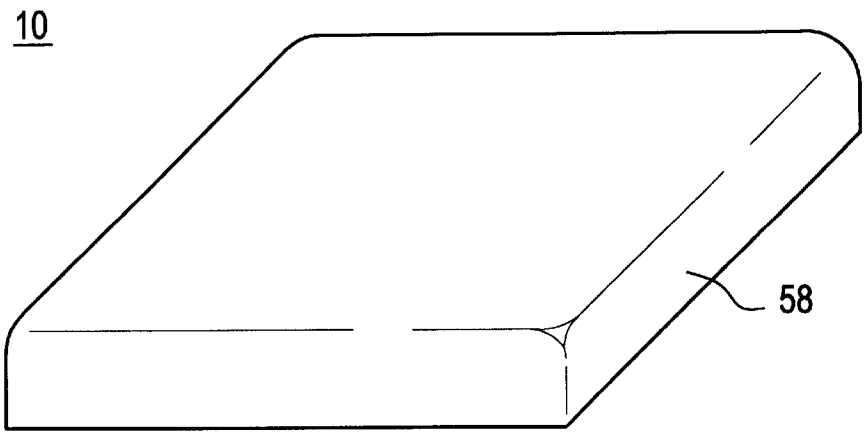
FIG. 1 is an exploded perspective view of an example piezoelectric filter that includes a piezoelectric resonator which is subjected to a method of adjusting group-delay characteristics according to a preferred embodiment of the present invention.
Figure 1:
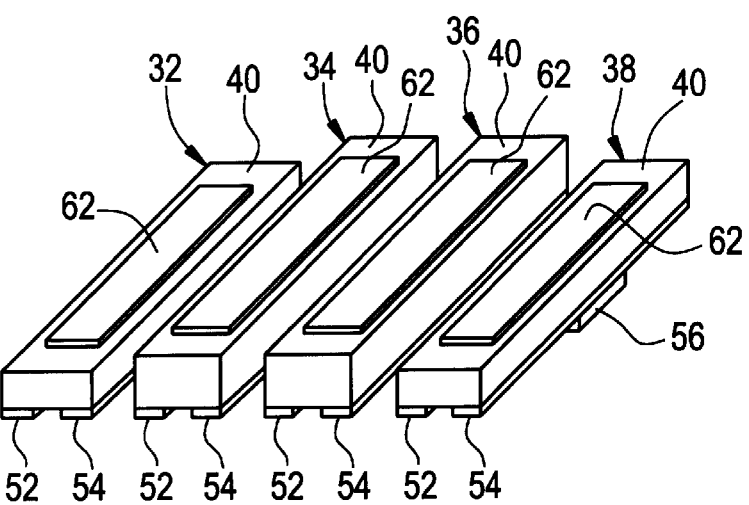
Figure 1:
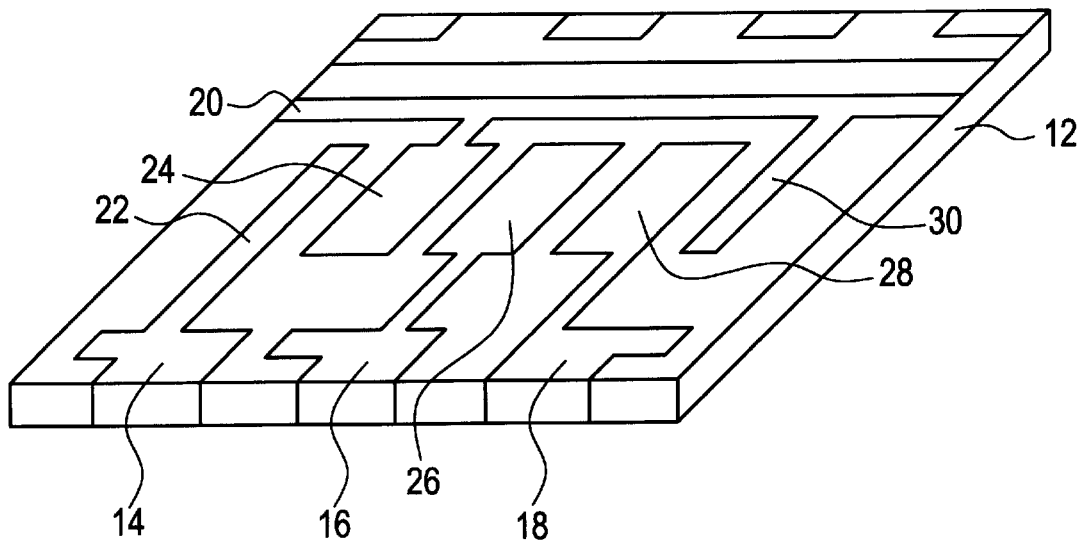

FIG. 1 shows a piezoelectric filter including multiple piezoelectric resonators. A method of adjusting group-delay-characteristics according to a preferred embodiment of the present invention is used for these piezoelectric resonators.

A piezoelectric filter 10 preferably includes an insulating substrate 12. On the insulating substrate 12, a plurality of pattern electrodes 14, 16, 18, and 20 are preferably provided. The pattern electrodes 14, 16, and 18 extend to one of the ends of the insulating substrate 12. The pattern electrode 20 is arranged along one of the ends of the insulating substrate 12, which opposes the end to which the pattern electrodes 14, 16, and 18 extend.

A plurality of lands 22, 24, 26, 28, and 30 are arranged to have intervals between the pattern electrodes 14, 16, 18, and 20. The first land 22 (numbered from the left in FIG. 1) is connected to the pattern electrode 14. The second and fifth lands 24 and 30 are connected to the pattern electrode 20. The third land 26 is connected to the pattern electrode 16. The fourth land 28 is connected to the pattern electrode 18.

Figure 2:
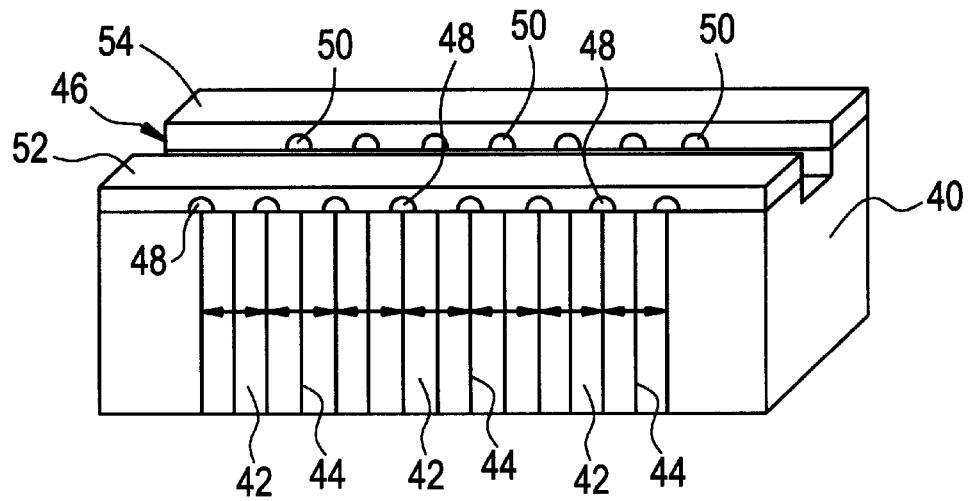
FIG. 2 is a view of an example structure of a piezoelectric resonator used in the piezoelectric filter in FIG. 1.

A plurality of piezoelectric resonators 32, 34, 36, and 38 are mounted on the lands 22, 24, 26, 28, and 30. As shown in FIG. 2, the piezoelectric resonator 32 includes a substantially rectangular base body 40. The base body 40 is preferably formed by overlaying multiple piezoelectric layers 42 and multiple internal electrodes 44. At this time, surfaces of the piezoelectric layers 42 and the internal electrodes 44 are arranged substantially perpendicular to the length direction of the base body 40. Piezoelectric layers 42 are arranged adjacently at two sides of each of the internal electrodes 44, and are polarized in the length direction of the base body 40 so as to oppose each other.

On one of peripheral surfaces of the base body 40, a groove 46 extending in the length direction is provided at an approximate central portion in the width direction. On one of the two sides of the groove 46, exposed portions of the internal electrodes 44 are covered alternately by insulators 48. On the other one of the opposing sides of the base body 40, exposed portions of the internal electrodes 44, which are not covered by the insulators 48, are covered by insulators 50. In this way, the internal electrodes 44 that are different on the two sides of the groove 46 are covered by either the insulators 48 or the insulators 50.

In addition, external electrodes 52 and 54 are preferably provided on one of the two sides and the other one of the two sides of the base body 40. Thus, the internal electrodes 44 adjacently arranged are connected alternately to the external electrodes 52 and 54.

The other piezoelectric resonators 34, 36, and 38 have a structure that is similar to the piezoelectric resonator 32. In the piezoelectric resonator described above, according to signals input to the external electrodes 52 and 54 that define input/output terminals, electrical fields are applied between the internal electrodes 44. Since the internal electrodes 44 are alternately connected to the external electrodes 52 and 54, electrical fields opposing each other are applied to the piezoelectric layers 42 which are adjacent to each other. Also, since the piezoelectric layers 42 are polarized so as to oppose each other, the entire base body 42 vibrates in a longitudinal vibration mode in response to the input signal described above.

Figure 3:
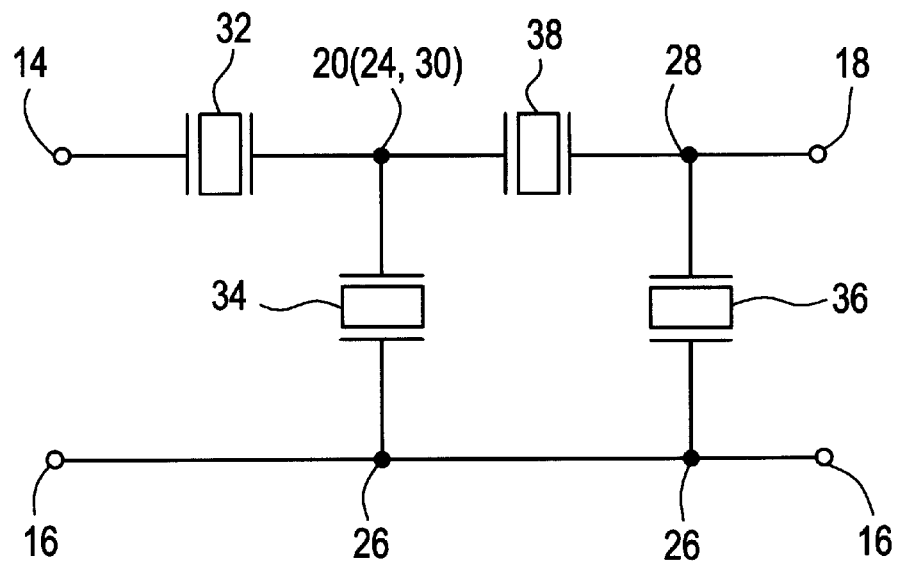
FIG. 3 is a circuit diagram of the piezoelectric filter in FIG. 1.

As shown in FIG. 3, the piezoelectric resonators 32, 34, 36, and 38 that vibrate in the aforementioned longitudinal vibration mode are connected in a ladder arrangement so as to define serial and/or parallel connections. In this case, conductive members 56 shown in FIG. 1 are arranged individually at approximately central portions of the external electrodes 52 and 54 of the piezoelectric resonators 32, 34, 36, and 38. The individual conductive members 56 are connected to the five lands 22, 24, 26, 28, and 30. Thus, the piezoelectric resonators 32, 34, 36, and 38 are spaced from the insulating substrate 12, thereby securing spaces required for vibration of the piezoelectric resonators 32, 34, 36, and 38.

In addition, a metal cover 58 shown in FIG. 1 is provided to cover the insulating substrate 12 so as to wrap the piezoelectric resonators 32, 34, 36, and 38. In this structure, insulation films are arranged at portions where the cover 58 and the insulating substrate 12 are in contact. The insulation films prevent short-circuiting that the pattern electrodes 14, 16, 18, and 20 may cause because of the cover 58.

In the above-described piezoelectric filter 10, the amount of attenuation is varied depending on the ratio of the capacitance of the piezoelectric resonators 32 and 38 for serial connection and the piezoelectric resonators 34 and 36 for parallel connection. For this reason, to obtain desired characteristics of the piezoelectric filter 10, the piezoelectric resonator 34 and 36 for parallel connection are designed to have capacitance that is larger than the capacitance of the piezoelectric resonator 32 and 38 for serial connection.

Figure 4:
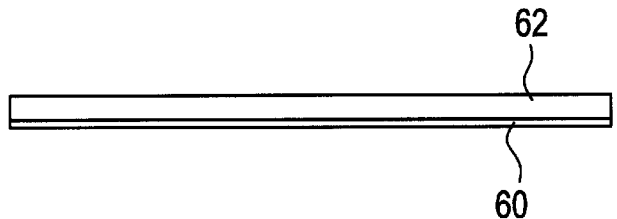
FIG. 4 is a view of a silicon sheet used for the adjustment of the group-delay characteristics of the piezoelectric resonator.
Figure 5:
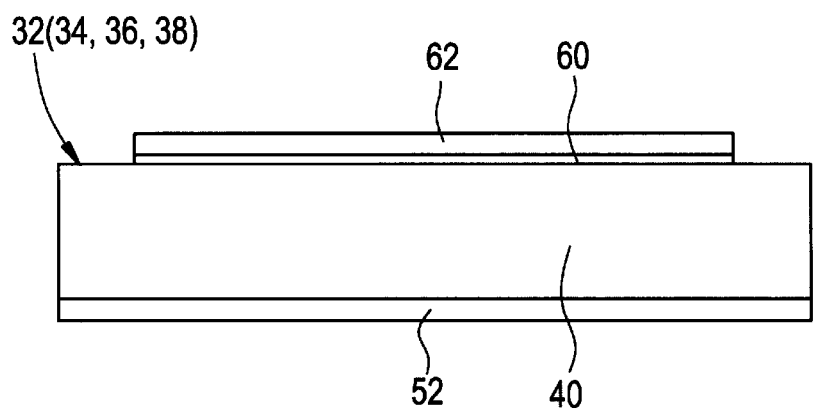
FIG. 5 is a view of the silicon sheet shown in FIG. 4, which is adhered onto an upper surface of the piezoelectric resonator.

To adjust group-delay characteristics of the piezoelectric filter 10, sheet members are adhered to the individual piezoelectric resonators 32, 34, 36, and 38. The sheet members work to adjust the group-delay characteristics of the individual piezoelectric resonators 32, 34, 36, and 38. As the sheet members, a material of which a Young's modulus (modulus of direct elasticity) is about 100 Mpa or smaller is preferably used. For example, as shown in FIG. 4, silicon sheets 62 each having an adherent portion 60 on one surface are used for the sheet members. As shown in FIG. 5, by adhering the silicon sheet 62 onto an upper surface of each of the piezoelectric resonators 32, 34, 36, and 38 that constitute the piezoelectric filter 10, damping for Qm of each of the piezoelectric resonators 32, 34, 36, and 38 is achieved. This adjusts the group-delay characteristics. The adjustment of the group-delay characteristics of the individual piezoelectric resonators 32, 34, 36, and 38 allows the group-delay characteristics of the piezoelectric filter 10 to be adjusted as required.

In the above, the silicon sheets 62 having multiple sizes are preliminarily press-processed, and are grouped according to size. Then, measuring probes or the like are connected to the individual piezoelectric resonators 32, 34, 36, and 38, thereby measuring electrical characteristics of the piezoelectric resonators 32, 34, 36, and 38. For this reason, although it is not shown in FIG. 1, a substrate for the piezoelectric resonators 32, 34, 36, and 38 must be designed in consideration of the arrangement of pattern electrodes. The pattern electrodes allow the measurement of the individual piezoelectric resonators 32, 34, 36, and 38.

For the individual piezoelectric resonators 32, 34, 36, and 38, silicon sheets 62 having a size that achieves required characteristics are selected according to measured electrical characteristics. The silicon sheets 62 having the selected size are adhered onto the upper surfaces of the piezoelectric resonators 32, 34, 36, and 38. Thus, according to the adjustment of the electrical characteristics, the group-delay characteristics of the piezoelectric filter 10 can be controlled within a predetermined range. In the selecting step for the silicon sheets 62, instead of preparing the silicon sheet 62 to have multiple sizes, the silicon sheets 62 of required sizes may be punched out of a large silicon sheet.

In this way, using the adjusting method described above allows a piezoelectric filter 10 having high group-delay characteristics is achieved. Also, use of the adjusting method allows, for example, preliminary examinations and periodical checking to be avoided, thereby allowing improvement in manufacturing procedures. In addition, use of the silicon sheets 62 does not require curing after they are adhered onto the piezoelectric resonators 32, 34, 36, and 38, thereby allowing another processing step to be eliminated, and also, allowing variation in characteristics thereof due to heating to be prevented.

Figure 6:
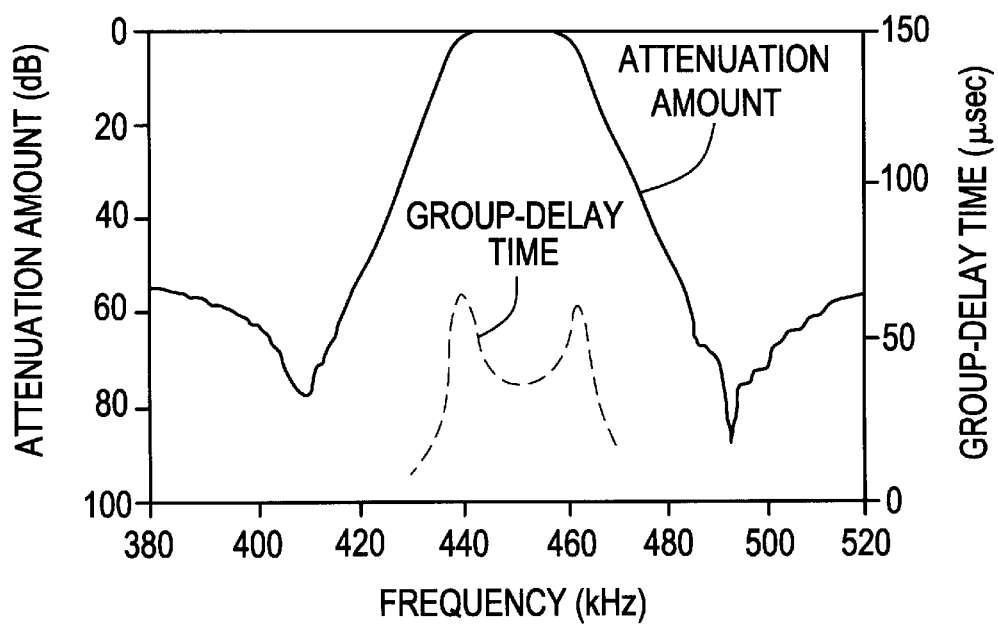
FIG. 6 is a characteristic graph indicating the amount of attenuation in the piezoelectric filter before the silicon sheet is adhered to each of the piezoelectric resonators and group-delay characteristics of the piezoelectric resonator.
Figure 7:
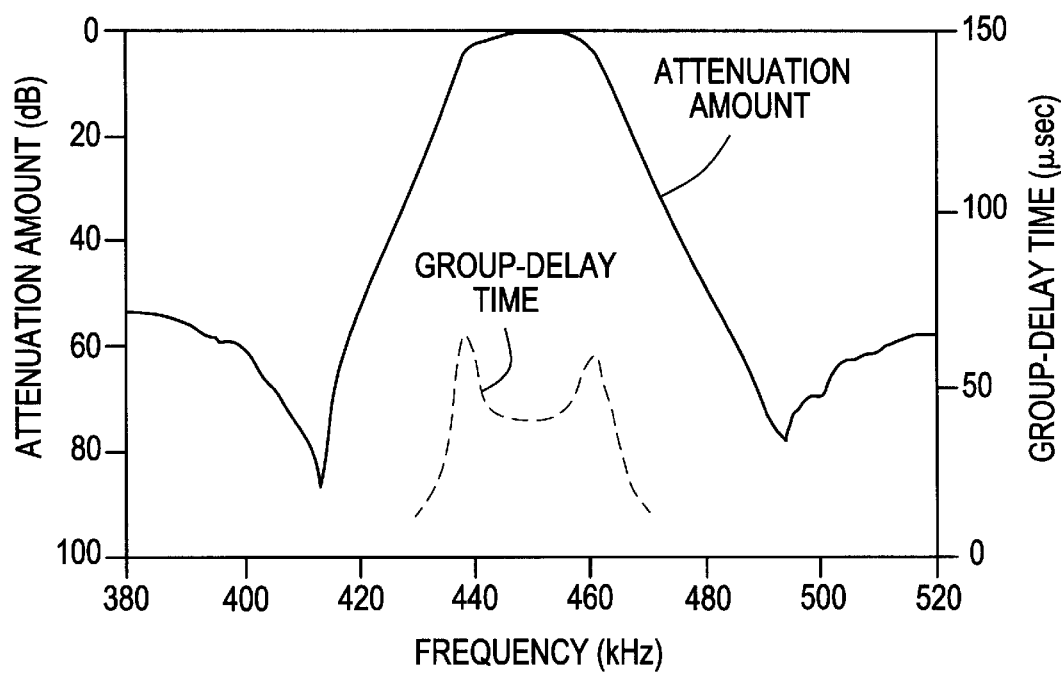
FIG. 7 is a characteristic graph indicating the amount of attenuation in the piezoelectric filter after the silicon sheet is adhered to each of the piezoelectric resonators and group-delay characteristics of the piezoelectric resonator.

FIGS. 6 and 7 individually show characteristics of the piezoelectric filter 10 before and after adjustment of the group-delay characteristics according to a preferred embodiment of the method of adjusting group-delay characteristics. In a piezoelectric filter prior to the adjustment, as shown in FIG. 6, group-delay ripples occur. However, in the piezoelectric filter after the adjustment, as shown in FIG. 7, group-delay ripples are minimized, and group-delay characteristics that are substantially smooth are achieved. In this way, adhesion of the soft silicon sheets 62 onto the piezoelectric resonators 32, 34, 36, and 38 allows for damping of the Qm characteristics of the piezoelectric resonators 32, 34, 36, and 38 to be performed. As a result, piezoelectric resonators 32, 34, 36, and 38 achieving minimized ripples are obtained.

In preferred embodiments of the present invention, the members that can be effective preferably have a maximum Young's modulus of about 100 MPa. However, it is preferable that sheet members having a Young's modulus ranging from about 0.1 to about 10 MPa are used. In an example in FIG. 7 showing characteristic graph, silicon sheets having a Young's modulus of about 1 MPa are preferably used. However, sheet members having a Young's modulus ranging from about 0.1 to about 10 MPa produce characteristics substantially equivalent to those shown in FIG. 7. Sheet members having a Young's modulus greater than about 100 MPa have characteristics that disturb vibration of the piezoelectric resonators 32, 34, 36, and 38. For this reason, the sheet members having a Young's modulus greater than 100 MPa are not suitable to be used for the adjustment of the group-delay characteristics.

Also, silicon sheets 62 of a pre-determined size may be prepared. In this case, preliminary examinations are carried out for individual piezoelectric resonators to be used in the piezoelectric filter 10 to obtain data of their initial group-delay characteristics. According to the data obtained from the examinations, silicon sheets 62 having a predetermined size by which the group-delay characteristics of the piezoelectric resonators that will be manufactured in a later step are determined to be near required group-delay characteristics are prepared. Then, the individual prepared silicon sheets 62 are adhered to the piezoelectric resonators 32, 34, 36, and 38, which constitute the piezoelectric filter 10, thereby allowing the group-delay characteristics of the piezoelectric filter 10 to be controlled to be within a predetermined range.

According to the above-described adjusting method, fine adjustment is difficult compared to the adjustment method in which the silicon sheets 62 are adhered according to electrical characteristics measured for the individual piezoelectric resonators 32, 34, 36, and 38. However, the latter adjusting method greatly improves the group-delay characteristics of the piezoelectric filter 10. In this adjusting method, the silicon sheets 62 need not be cured after they are adhered onto the piezoelectric resonators 32, 34, 36, and 38. Therefore, this adjusting method does not cause variation in characteristics due to heating. For this method to be effective, it requires the use of silicon sheets 62 having the most suitable size determined according to periodical measurements of initial characteristics of the piezoelectric resonators 32, 34, 36, and 38.

Figure 8:
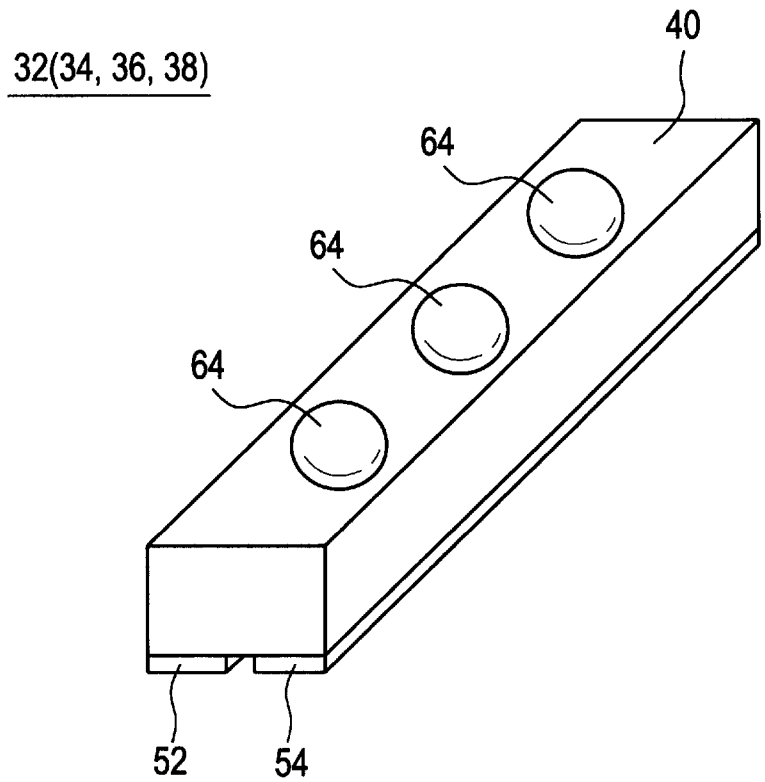
FIG. 8 is a perspective view used to explain another example adjusting method for the group-delay characteristics.
Figure 9:
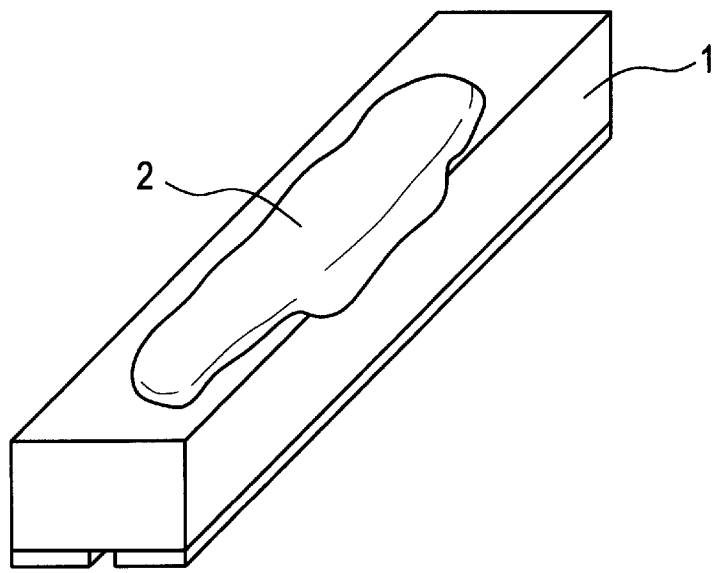
FIG. 9 is a perspective view of an example in which uncured synthetic resin material is adhered on a piezoelectric resonator according to a conventional adjusting method for group-delay characteristics of piezoelectric resonators.

The formed material does not need to be in a sheet form, and may be one of other cured synthetic resin materials each having a maximum Young's modulus of about 100 MPa. The synthetic resin materials preferably include a urethane material and a silicon material each of which the Young's modulus is preferably about 100 MPa or smaller. With one of these materials, as shown in FIG. 8, for example, substantially circular sheet members 64 are adhered onto the piezoelectric resonators 32, 34, 36, and 38. In this case also, the sheet members 64, which will be adhered onto the individual piezoelectric resonators 32, 34, 36, and 38, may either be one of the two types. That is, the sheet members 64 may be those selected corresponding to the initial characteristics of the individual piezoelectric resonators 32, 34, 36, and 38 or may be those prepared according to the results of the preliminary examinations performed to determine the initial characteristics for the individual piezoelectric resonators 32, 34, 36, and 38. In these cases, as shown in FIG. 8, in addition to adhering onto an approximately central portion of each of the piezoelectric resonators 32, 34, 36, and 38, the sheet members 64 may be adhered to multiple portions thereof corresponding to the initial characteristics thereof. It should be noted that the shape of the formed material 64 may be optionally determined. For example, the shape may be either substantially rectangular or substantially polygonal.

As described above, it is preferred to use one of the soft materials of which the Young's modulus is about 100 MPa or smaller. Also, since the cured sheet members have characteristics that minimize variation in weight exerted on the piezoelectric resonators 32, 34, 36, and 38, precise adjustment can be implemented. In addition, since portions onto which the sheet members are adhered can be specified, adhesion onto portions where the characteristics of the piezoelectric resonators 32, 34, 36, and 38 are reduced can be prevented. That is, reduction in the characteristics because of the sheet members can be prevented. Furthermore, the described materials require no heat treatments after they are adhered, thereby preventing characteristics to be reduced because of heating.

The described methods of various preferred embodiments of the present invention may be applied not only to the piezoelectric resonators 32, 34, 36, and 38 of the described stacked type, but also piezoelectric resonators in which electrodes are disposed on two surfaces of a base body in a single plate configuration. Thus, the adjusting methods of preferred embodiments of the present invention may be applied to piezoelectric resonators of any type. Also, the portion onto which the formed material is adhered is not restricted to the upper surface of the piezoelectric resonator, and may be the opposing lower surface thereof. In this case, as a matter of course, electrical connection must be prepared between external electrodes of the piezoelectric resonators and pattern electrodes disposed on an insulating substrate.

As above, the present invention has been described with reference to what are presently considered to be preferred embodiments thereof. However, it is to be understood that the present invention is not restricted to the preferred embodiments and modifications thereof. On the contrary, the present invention is intended to cover various other modifications and equivalent arrangements included within the spirit and scope of the invention.

What is claimed is:

1. A method of adjusting group-delay characteristics of piezoelectric resonators, comprising the steps of:
    preparing members having multiple sizes and each of which has a maximum Young's modulus of about 100 MPa;
    measuring initial group-delay characteristics of the piezoelectric resonators;
    selecting the members having a size which is suitable to the piezoelectric resonators for adjusting the initial group-delay characteristics measured in the measuring step to achieve required group-delay characteristics; and
    adhering the members selected in the selecting step onto the piezoelectric resonators.

2. A method of adjusting group-delay characteristics of piezoelectric resonators as claimed in claim 1, wherein each of the members is a silicon sheet having an adherent portion on one surface thereof.

3. A method of adjusting group-delay characteristics of piezoelectric resonators as claimed in claim 1, wherein each of the members is a cured synthetic resin material.

4. A method of adjusting group-delay characteristics of piezoelectric resonators as claimed in claim 1, wherein a plurality of the members are sheet members and are adhered to a plurality of piezoelectric resonators.

5. A method of adjusting group-delay characteristics of piezoelectric resonators as claimed in claim 1, wherein the members are arranged to adjust the group-delay characteristics of each of the piezoelectric resonators.

6. A method of adjusting group-delay characteristics of piezoelectric resonators as claimed in claim 1, wherein in the step of selecting the members, the members are punched from a single silicon sheet.

7. A method of adjusting group-delay characteristics of piezoelectric resonators as claimed in claim 1, wherein the members comprise sheet members having a Young's modulus ranging from about 0.1 to about 10 Mpa.

8. A method of adjusting group-delay characteristics of piezoelectric resonators as claimed in claim 1, wherein the members comprise sheet members having a shape that is one of substantially rectangular and substantially polygonal.

9. A method of adjusting group-delay characteristics of piezoelectric resonators, comprising the steps of:
    measuring initial group-delay characteristics of the piezoelectric resonators;
    preparing sheet members to have a plurality of sizes and each of which has a maximum Young's modulus of about 100 MPa, the step of preparing sheet members being performed such that the sheet members prepared adjust the initial group-delay characteristics measured in the measuring step to achieve required group-delay characteristics of the piezoelectric resonators; and
    adhering respective sheet members prepared in the preparing step onto the piezoelectric resonators to produce the required group-delay characteristics of the piezoelectric resonators.

10. A method of adjusting group-delay characteristics of piezoelectric resonators as claimed in claim 9, wherein each of the sheet members is a silicon sheet having an adherent portion on one surface thereof.

11. A method of adjusting group-delay characteristics of piezoelectric resonators as claimed in claim 9, wherein each of the sheet members is a cured synthetic resin material.

12. A method of adjusting group-delay characteristics of piezoelectric resonators as claimed in claim 9, wherein each of the members is a silicon sheet having an adherent portion on one surface thereof.

13. A method of adjusting group-delay characteristics of piezoelectric resonators as claimed in claim 9, wherein each of the members is a cured synthetic resin material.

14. A method of adjusting group-delay characteristics of piezoelectric resonators as claimed in claim 9, wherein a plurality of the members are sheet members and are adhered to a plurality of piezoelectric resonators.

15. A method of adjusting group-delay characteristics of piezoelectric resonators as claimed in claim 9, wherein the members are arranged to adjust the group-delay characteristics of each of the piezoelectric resonators.

16. A method of adjusting group-delay characteristics of piezoelectric resonators as claimed in claim 9, wherein in the step of selecting the members, the members are punched from a single silicon sheet.

17. A method of adjusting group-delay characteristics of piezoelectric resonators as claimed in claim 9, wherein the members comprise sheet members having a Young's modulus ranging from about 0.1 to about 10 Mpa.

18. A method of adjusting group-delay characteristics of piezoelectric resonators as claimed in claim 9, wherein the members comprise sheet members having a shape that is one of substantially rectangular and substantially polygonal.

* * * * *